United States Patent
Kessler et al.

(10) Patent No.: US 8,745,864 B2
(45) Date of Patent: Jun. 10, 2014

(54) METHOD OF COUPLING DIGITIZING SENSORS TO A STRUCTURE

(75) Inventors: Seth S. Kessler, Newton, MA (US); Jeong-Beom Ihn, Bellevue, WA (US); Christopher T. Dunn, Salem, MA (US); Jeffrey Lynn Duce, Milton, WA (US); Michael G. Borgen, Wilmington, MA (US)

(73) Assignee: The Boeing Company, Chicago, IL (US)

( * ) Notice: Subject to any disclaimer, the term of this patent is extended or adjusted under 35 U.S.C. 154(b) by 872 days.

(21) Appl. No.: 12/851,424

(22) Filed: Aug. 5, 2010

(65) Prior Publication Data
US 2011/0222225 A1    Sep. 15, 2011

Related U.S. Application Data

(60) Provisional application No. 61/232,685, filed on Aug. 10, 2009.

(51) Int. Cl.
*H01R 43/00*    (2006.01)
*H05K 13/00*    (2006.01)

(52) U.S. Cl.
USPC ............. 29/854; 29/825; 29/829; 29/846

(58) Field of Classification Search
USPC ........... 29/854, 825, 829, 830, 846, 852, 874; 361/267, 679.02, 760; 370/353, 370/395.65; 428/210, 469, 472
See application file for complete search history.

(56) References Cited

U.S. PATENT DOCUMENTS

| | | | |
|---|---|---|---|
| 5,278,442 A | 1/1994 | Prinz et al. | |
| 5,294,751 A | 3/1994 | Kamada | |
| 5,499,445 A * | 3/1996 | Boyle et al. | 29/830 |
| 6,370,138 B1 * | 4/2002 | Kim et al. | 370/353 |
| 6,620,645 B2 | 9/2003 | Chandra et al. | |
| 7,270,844 B2 | 9/2007 | Renn | |
| 7,373,260 B2 | 5/2008 | Kessler et al. | |
| 7,582,359 B2 | 9/2009 | Sabol et al. | |
| 7,618,712 B2 * | 11/2009 | Sabol et al. | 428/469 |
| 2005/0033819 A1 | 2/2005 | Gambino et al. | |

(Continued)

FOREIGN PATENT DOCUMENTS

| | | |
|---|---|---|
| WO | WO 00 69235 A1 | 11/2000 |
| WO | WO 2005 084358 A2 | 9/2005 |
| WO | WO 2009 144489 A1 | 12/2009 |
| WO | WO 2009 144490 A1 | 12/2009 |

OTHER PUBLICATIONS

International Search Report and Written Opinion of the International Searching Authority, European Patent Office, International Application No. PCT/US2011/042874, Oct. 7, 2011 (12 pgs).
U.S. Appl. No. 12/851,375, filed Aug. 5, 2010, 49 pages.

*Primary Examiner* — Thiem Phan
(74) *Attorney, Agent, or Firm* — Toler Law Group, PC

(57) ABSTRACT

Systems and methods of coupling digitizing sensors to a structure are disclosed. A particular method includes applying one or more communication traces and one or more power traces to a structure using at least one direct-write technique. The method may also include coupling the one or more communication traces to at least one digitizing sensor. The method may also include coupling the one or more power traces to the at least one digitizing sensor.

20 Claims, 10 Drawing Sheets

(56) References Cited

U.S. PATENT DOCUMENTS

| | | |
|---|---|---|
| 2006/0169837 A1 | 8/2006 | Bird et al. |
| 2006/0288794 A1 | 12/2006 | Hardwicke et al. |
| 2007/0003781 A1 | 1/2007 | de Rochemont |
| 2008/0003353 A1 | 1/2008 | Hardwicke et al. |
| 2008/0054645 A1 | 3/2008 | Kulkarni et al. |
| 2008/0289426 A1 | 11/2008 | Kearns et al. |
| 2009/0219040 A1 | 9/2009 | Shinde et al. |
| 2009/0259411 A1 | 10/2009 | Loomis et al. |

* cited by examiner

METHOD OF COUPLING DIGITIZING SENSORS TO A STRUCTURE

CLAIM OF PRIORITY

This application claims priority from U.S. Provisional Patent Application No. 61/232,685, entitled "Systems and Methods of Coupling Sensors to a Structure," filed on Aug. 10, 2009, which is incorporated herein by reference in its entirety.

FIELD OF THE DISCLOSURE

The present disclosure is generally related to coupling sensors to a structure.

BACKGROUND

Many structures incorporate a distributed network of sensors in order to successfully fulfill their function. For example, structural health monitoring (SHM) systems may use sensors distributed about a structure. SHM systems can provide the ability to detect and interpret adverse "changes" in a structure to reduce life-cycle costs and to improve reliability. SHM systems may utilize non-invasive detection sensors that are integrated into a structure to continuously monitor components for damage, such as cracks or de-lamination.

Implementing SHM can improve asset reliability, safety and readiness while reducing life-cycle costs. However, these improvements can come at the expense of weight, power consumption and computational bandwidth. For example, an SHM system may utilize various sensors (such as strain gauges, thermocouples and optical fibers) permanently mounted in regions of interest. The number and location of these sensors may be limited due to required infrastructure. The SHM system may have one or more analog cables (e.g., coaxial cables) from each sensing element (or sensor node) to a remote hardware location. These cables can be long, introducing electromagnetic interference (EMI) susceptibility and signal attenuation due to stray capacitance. Infrastructure of the SHM system, such as the cables, can add significant weight (e.g., more than about 6 kg/m^2 including connectors), and installation can be labor intensive. Furthermore, the cables and connectors introduce several failure points, as both the cables and the connectors are susceptible to environmental and mechanical durability issues. Traditional data acquisition units also can be bulky and expensive as hardware components are added to accommodate the sensors. These concerns may be further exacerbated when the RIM system is operated in a harsh environment, such as extreme temperatures, shock, vibration and g-loading.

SUMMARY

Systems and methods of coupling digitizing sensors to a structure are disclosed. A particular method includes applying one or more communication traces and one or more power traces to a structure using at least one direct-write technique. The method may also include coupling the one or more communication traces to at least one digitizing sensor. The method may also include coupling the one or more power traces to the at least one digitizing sensor.

In a particular embodiment, a system includes a digitizing sensor node. The system may also include a bus including a plurality of conductive elements applied to a substrate. A first conductive element of the bus may be coupled to the digitizing sensor node using a direct-write technique.

In a particular embodiment, a structure includes at least one structural element and at least one digitizing sensor coupled to the at least one structural element. The system may also include a bus having a plurality of conductive traces applied on the at least one structural element using a direct-write technique. One or more power traces of the bus may provide power to the at least one digitizing sensor. Additionally, one or more communication traces of the bus may enable data communication from the at least one digitizing sensor.

DETAILED DESCRIPTION

Figure 1:
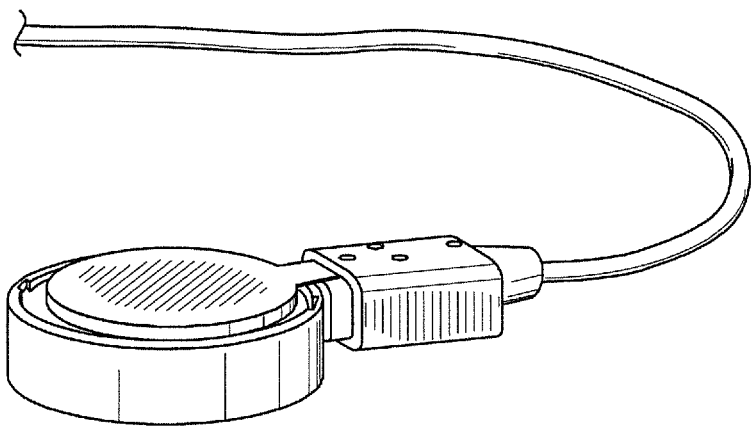
FIG. 1 is an illustration of an embodiment of an Intelli-Connector™ digital structural health monitor (SHM) node.

In some situations, analog data transfer may be undesirable, as it may be susceptible to interference, may promote signal attenuation, and may use discrete wires for each sensor element. One technique that may mitigate the problems of analog data transfer is local sensor digitization. In a particular embodiment, a point-of-measurement (POM) data logging system may use a digital sensor infrastructure to co-locate analog-to-digital chips with sensor elements so as to enable local digitization thereby eliminating noise and attenuation. By converting analog signals into digital data at the point-of-measurement, the problems of electromagnetic interference (EMI) and attenuation may virtually disappear. Local digitization can enable connecting sensors serially, via a digital sensor-bus, to reduce total cable length. In a particular embodiment, microprocessors may also be used to enable use of a bus topology, thereby reducing cabling through use of a common serial digital protocol. For example, data volume traversing the bus can also be greatly reduced by implementing signal processing and feature extraction techniques locally at the point of measurement. Programmable logic may be used to differentiate data that needs to be reported to a central processor from other information. Additionally, memory may be provided locally at a sensor of a POM data logging system to log or buffer sensed data.

The use of a point-of-measurement data logging system alone may not address all of the concerns of added weight, complexity and labor intensive installation of SHM systems, however, as there may still be a cable harness to manually install. Durability of the cable harness may also still be of concern. In a particular embodiment, a cable-free digital sensor-bus may be utilized to address these concerns. For example, the cable-free digital sensor-bus may be installed at a structure to be monitored using a direct-write (DW) technology. Various DW technologies may enable conformal deposition of conductive and/or non-conductive materials onto a variety of complex surfaces with a high degree of precision. The DW technology may selectively deposit electrically conductive and/or insulative traces with very fine tolerances either directly onto the structure or onto a layer that can be applied to the structure. Such conformal DW traces may create a structural component with multifunctional capabilities, increasing instrumentation reliability while greatly reducing weight as compared to a cable-based equivalent. For example, the cable-free digital sensor-bus may weigh less than about 25 grams per meter of length. Additionally, the cable-free digital sensor-bus may be flexible or semi-flexible to reduce installation concerns.

In a particular embodiment, a Plasma Flame Spray (PFS) DW technique may be used. PFS enables a metal (e.g., copper) or a ceramic material to be electrically liquefied for application on the structure. In another particular embodiment, a Jetted Atomized Deposition (JAD) DW technique may be used. JAD enables a metal (e.g., silver) or a polymer (e.g., an ultraviolet (UV) light curable epoxy) to be placed on the structure in a manner similar to an ink-jet printer and subsequently hardened.

For some retrofit applications, the structures to be monitored may be too large to be shipped to a remote location for installation of a cable-free digital sensor system. In a particular embodiment, such structures may be retrofit in situ. For example, DW techniques used for these retrofit applications may be selected to avoid the use of specialized equipment or chambers that are not portable. To illustrate, a DW technique similar to a silk-screen method, described herein with reference to generation of a test system, may be used. In another example, for a large-scale retro-fit embodiment, traces for the cable-free digital bus are applied to intermediary layers in a production environment and subsequently installed in situ on the structure. For example, the traces may be patterned on a series of simple and modular intermediary layers, which may be adhered to the structure on-site.

Using DW technology to pattern a cable-free digital bus may enable reliable transfer of electrical signals through patterned traces. In a particular embodiment, the trace geometry, spacing and overall configuration of the cable-free digital bus may be precisely designed based on design criteria of the system. In a particular illustrative embodiment, sensor nodes of a SHM system may communicate via a controller area network (CAN) via the cable-free digital bus. In such a network, four sets of traces and/or layers may be considered: communication, synchronization, power, and shielding. CAN protocol networks use a differential fixed-impedance protocol. Thus, two conductors (CAN-high & CAN-low) with an impedance between around 100-130 Ohms may be used for communications. The sensor nodes may optionally use independent high-speed digital synchronization over an RS-422 protocol. This synchronization may also use a differential fixed-impedance protocol using two conductors (sync-high & sync-low) with impedance between about 100-130 Ohms. In a particular embodiment, for power, the sensor nodes have a maximum current draw of about 108 mA. The Intelli-Connector™ HS version sensor node (available from Metis Design Corporation (MDC)) may use a supply voltage of 28 VDC (power & ground) and a standby current draw of 30 mA. For a benchmark system (discussed with reference to the tests that have been conducted), assuming that there would be one exciting node and no more than six sensing nodes at a time, the total current draw would be about 3.5 A. For this benchmark system, nominally six parallel traces may be used for communication, sync and power. In a particular embodiment, shielding may also be provided. For example, parallel shield traces may separate the communication, sync and power traces. Also, since the pairs cannot readily be twisted with DW techniques, a shield layer may be used around the communication and sync traces to couple the pairs and protect them against EMI.

To resolve issues relating to continuous monitoring of aerospace components, the MDC has developed an intelligent SHM infrastructure architecture called the Intelli-Connector™ digital sensor infrastructure. The Intelli-Connector™ digital sensor infrastructure may be used as a direct replacement of traditional instrumentation, such as oscilloscopes and function generators. The Intelli-Connector™ digital sensors can reduce overall cable weight and increase signal fidelity by digitizing at the point-of-measurement. Hardware requirements can also be reduced as compared to analog systems through distributed local processing. Sensor density can be reduced as compared to analog systems by using a pulse-echo mode. In a particular configuration, multiple digital sensors can connect through a FireWire-type harness and can be synchronized for a pitch-catch mode. The Intelli-Connector™ digital sensor infrastructure can facilitate remote SHM testing for multiple methods including Lamb wave, Rayleigh wave or other guided waves (GW), modal analysis or frequency response (FR) and acoustic emission (AE). In a particular embodiment, Lamb waves are analyzed to detect damage to a system coupled to the Intelli-Connector™ digital sensor infrastructure. Lamb waves are a form of elastic perturbation that propagates in a solid medium. In particular embodiments, Lamb wave analysis provides good damage size and detection range to sensor area ratio. Additionally, Lamb wave analysis may provide good sensitivity and range may scale with input power level (with some limitations). In an illustrative embodiment, Lamb wave analysis can be used to detect and locate damage to a system based on how the damage slows down the waves. In another illustrative embodiment, Lamb wave analysis may detect and locate damage based on how the damage reflects the waves. Further, Lamb wave analysis can determine damage location using a single sensor node or using multiple sensor nodes cooperatively. For example, a single sensor node can be active to detect damage using a "pulse and listen" to initiate a pulse and listen of a reflection of the pulse. In another example, a first sensor node may be passive and a second sensor node may be active. The active sensor node may initiate a pulse and the passive sensor node may listen for the pulse to detect damage. The active sensor node and the passive sensor node may be synchronized to enable determination of timing information related to the wave.

While the benchmark system described below uses Lamb waves to detect damage, as mentioned above, other techniques to detect damage could also be used. For example, to detect Lamb waves the Intelli-Connector™ digital sensor infrastructure uses about 24V at the end of the bus to operate. This may limit the number of sensors that can be served over a fixed distance and spacing within the sensor-bus. In a particular embodiment, an acoustic emission (AE) system may require only about 3.3V at the end of the bus to operate, which may reduce certain power line constraints. Additionally, synchronization may be important to implement Lamb wave methods, thus sync lines may be used. However, using AE methods may not require sync lines and may relax constraints on synchronization of the communication lines as well, which may make the communication traces easier to design.

In various embodiments, a digitizing sensor node includes at least one processor that processes information gathered by the digitizing sensor node and transmits the processed information via the bus. As an example for design of a cable-free digital sensor bus and for testing purposes, the digital sensor used was the Intelli-Connector™ digital sensor node, as shown in FIG. 1. The Intelli-Connector™ digital sensor node is capable of local computation and processing. Designed mainly with piezoelectric-based methods in mind that allow large-area coverage with reduced sensor densities, the Intelli-Connector™ digital sensor node can facilitate remote SHM for guided waves (GW), frequency response (FR) and acoustic emission (AE) techniques. The Intelli-Connector™ digital sensor node is about 25 mm diameter by about 8 mm tall, weighs about 4 grams and is encapsulated in urethane to conform to MIL-STD-810 and DO-160. The Intelli-Connector™ digital sensor node can excite arbitrary functions over 3.4 MS/s at 20 Vpp and can digitize 16-bit data at 1 MHz with remotely programmable gains. In use, a SHIM system may also include: connectors and cables to connect sensors to the SEM system; amplifiers to improve outgoing actuation or incoming signals; data acquisition (rate and resolution of sensor signal digitization); computation to control and process data; memory to buffer or store data; communications to link sensors, hardware and users; and power to provide excitation source and supply for electronics.

It is believed that in particular configurations, the Intelli-Connector™ digital sensors infrastructure can withstand shock testing up to 90,000 g's and has little impact on the structure being monitored. For example, the Intelli-Connector™ digital sensors infrastructure can use surface mounted sensors. It is further believed that, in particular configurations, the Intelli-Connector™ digital sensors infrastructure can withstand a reasonable range of MIL-STD temperatures (−40 F to 180 F). The software-centric nature of the Intelli-Connector™ digital sensors infrastructure may enable mass-produced hardware to be placed anywhere, rather than in custom shaped layers. Additionally, using piezoelectric-based methods, such as Lamb waves and Acoustic Emission in a pulse-echo mode, may enable large-area coverage with reduced sensor densities.

In a particular embodiment, a miniaturized version of an Intelli-Connector™ digital sensor may be used. The miniaturized version may have all packaging removed such that it is a wire-bond design. By removing the packaging, the weight of the sensor device may be reduced by 1 to 2 orders of magnitude. The form-factor and height may also be reduced by 50-80% in each dimension. The temperature survivability may also be improved since there will be no plastic cases or solder to melt. Further, the high-g, shock and vibration characteristics may be improved as well based on the lower mass. Thus, the miniaturized version may be appropriate when weight, form-factor, temperature survivability, high-g shock or vibration characteristics are of concern.

As used herein, unless otherwise noted in the particular context, the terms sensor, digital sensor, digital sensor node, and sensor node refer to any sensor used with a SEM system, such as the Intelli-Connector™ digital sensor nodes described above. In a particular embodiment, the digital sensors may be applied to a structure to be monitored using an adhesive. Adhesive thickness and stiffness may be selected to transmit the most ultrasonic energy into the structure from the sensors and vice versa. For example, too thick of an adhesive material may provide a large shear-lag effect, which may dampen out the wave within the adhesive layer. Too stiff of an adhesive may appear as a boundary condition and create artificial reflections. In a particular embodiment, the adhesive layer acts as an impedance matched transition layer between the sensor and the host structure. When a cable-free digital sensor bus is used for data communications, thickness and properties of an adhesive used to apply the bus may also be a concern. Beyond the shear coupling, another consideration when a cable-free digital sensor bus is used may be heterogeneity of the traces with respect to the wave front. In a particular embodiment, the layers beneath and directly surrounding an actuator or sensor are homogeneous so that there are no obstructions to excited or sensed waves that could either create additional reflections or cause acceleration or deceleration of the signal, thus introducing algorithm errors.

In a particular embodiment, a modified controller-area network (CAN) protocol is employed to daisy-chain multiple sensors on the same bus. As used herein, unless otherwise noted in the particular context, a bus, a DW bus, and a cable-free digital bus refer to a set of conductive elements generated using a direct write technique. In particular embodiments, such buses may be used to enable data communications, to provide synchronization, to provide power, or any combination thereof, to one or more sensor nodes. Communications using the CAN protocol can be sensitive to the transmission impedance present. Additionally, the digitizing sensors (such as the Intelli-Connector™ digital sensors) may function best with well conditioned power. Since impedance and power conditioning can be related to bus characteristics, design of a DW bus system for use with the digitizing sensors may be important. For example, DW trace widths and spacings may be selected to reduce these concerns. Additionally, shielding may be used in a DW bus system to further reduce these concerns. In addition, passive components may be selectively used in the DW bus system at the digitizing sensors, at hubs in front of CAN driver chips, or both to regulate and correct the impedance to ensure reliable communication on a large network.

In a particular embodiment, coupling digitizing sensors with a DW bus system may enable cable-free data transfer. Such embodiments may benefit from computational and power reducing benefits of point-of-measurement technology, as well as reduced mass and increased robustness offered by DW technology. Such an embodiment may be well suited for use in large-area composite structures, particularly for space applications where mass may be important and operating conditions may include extreme environments.

Several factors may be considered to determine an appropriate method to attach the digitizing sensors and other hardware to the DW traces of the cable-free digital sensor bus. For example, one concern is robustness and reliability of mechanical and electrical connections. Ease of installation may also be of concern since the sensor network may be relatively large. Thus, complex procedures or procedures that require a high degree of precision may drive up the system cost substantially. Another concern may be obstruction of incident waves. Wave propagation may be a consideration when routing traces in a flexible circuit and when routing traces of the DW bus.

Although the systems and methods disclosed focus on the Intelli-Connector™ digital sensors for SHM systems, in various embodiments other types of sensors may be used in conjunction with a cable-free digital sensor bus. For example, acoustic wave sensors, eddy current sensing devices, magnetic alloy devices, fiber optic devices, other sensors, or any combination thereof may be used. An actuator separate from the digitizing sensor node may be coupled to the bus, where the actuator and the digitizing sensor node are synchronized for data gathering via a synchronization signal via the bus. To illustrate, in one embodiment, active acoustic emission technology may be used with the disclosed cable-free digital sensor bus. Such active acoustic emission technology may use embedded actuators and sensors within a composite laminate to send a broadband pulse.

While various DW technologies may deposit traces on the structure in any pattern designed, reliably coupling digitizing sensors to a DW bus may be problematic. For example, the digitizing sensors may be adapted to use a 6-pin FireWire cable for power and communication. The FireWire cable may include 6 wires. The digitizing sensors may use one pair of wires for 5V power, one pair of wires for communicating digital data, and one pair of wires for high precision synchronization and remote firmware re-programming. Typically, the 6-pins may be connected to a digitizing sensor via a soldered and overmolded wire at 6-leads on a printed circuit board (PCB) of the digitizing sensor. Using a FireWire connector to connect a sensor to the DW traces may present difficulties. For example, creating 3-D vias for the connectors using DW techniques may be difficult. Additionally, the DW traces may be very close together leading to space constraints. Further, a break in impedance on the main sensor-bus trunk may cause communication reflections. Also, the FireWire connectors add weight and potentially a failure point. In a particular embodiment, the sensors or a flexible circuit may be located directly over the DW traces and bonded to make contact. However, this arrangement may present alignment complexities.

Figure 2:
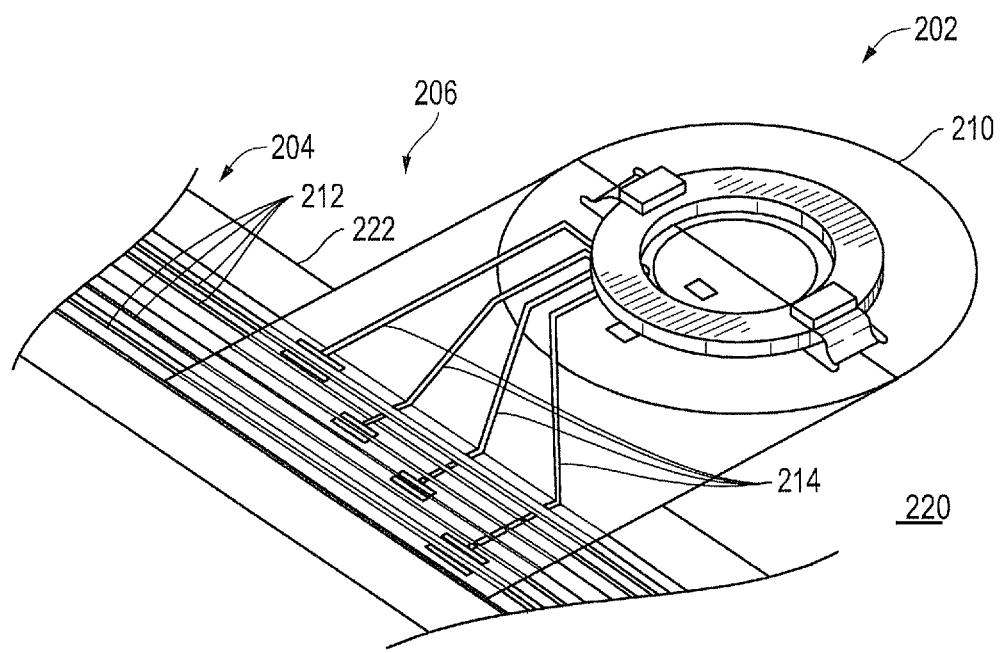
FIG. 2 is a schematic of digital sensor node flexible circuit with tail.

As shown in the embodiment illustrated in FIG. 2, to couple a digitizing sensor 202 to a DW bus 204, traces of a flexible circuit tail 206 may be routed to a bottom (e.g., analog side) of the PCB that connects to a piezo/flexible circuit assembly of the digitizing sensor 202. The flexible circuit tail 206 may be used to route digital traces to break-out locations where the digital traces can connect to the DW traces of the DW bus 204. In a particular embodiment, the flexible circuit tail 206 is designed to shield the sensor signal from EMI and to produce as little interference for the actuator for transferring a clean, omni-directional signal into the structure.

In a particular embodiment, during use of a digitizing sensor system, the FireWire cable may be connected to several devices in a network. The network may include a hub device. The hub may be coupled to the bus and be adapted to receive signals from the digitizing sensor node via the bus using a first protocol and to convert the signals to a second protocol. For example, the hub may multiplex multiple cable harnesses, provide conditioned power to the DW bus 204, and convert CAN protocol signals into USB protocol signals so that a simple PC can control the network. When the FireWire cable is replaced with DW traces, flexible traces may be used to attach to the DW traces to a PCB of the hub in a manner similar to that described above with reference to coupling a digitizing sensor to the DW bus 204.

In another embodiment, a flexible circuit 210 (such as one that is already employed on the bottom of some SHM sensor nodes) may be used to connect the sensor elements to a digital board, and to extend a flexible circuit "tail" (or "flex-tail") outside the footprint of the sensor for the DW sensor-bus attachment, seen in FIG. 2. The tail 206 may have a trace pattern similar to or identical to that of the DW bus (communication, sync, power & shield). Reasonable spacing may be provided down a length of the tail. The flexible circuit tails 206 may be perpendicular to the bus traces in orientation.

In a particular embodiment, DW techniques may be used to apply or to write bus traces 212 to these flexible circuit tails (also referred to herein as "flex-tails"). To illustrate, the sensor may be coupled to the bus traces 212 by overwriting the flex-tail 206 with a direct-write conductive material. For example, the flex-tail 206 may be bonded down to a structure 220. A Kapton overlay may selectively expose conductors 214 at various points down the length of the flex-tail 206. The flex-tail 206 may be bonded down to the structure 220 prior to a DW deposition stage. The DW traces 212 may be patterned directly over the conductors 214 of the flex-tail 206. The DW traces 212 may then be reinforced with an epoxy insulator 222, which may also be part of the DW process. This arrangement may have a relatively small mass impact, and may form a mechanically and electrically reliable and durable connection.

In a particular embodiment where the structure 220 is a graphite fiber composite (or another conductive material), to prevent the traces 212 and 214 from shorting out on the conductive graphite fibers of the structure 220, a non-conductive layer (not shown) may be placed on the structure 220 before the traces are applied. For example, an approximately 4 mil thick PEEK pressure sensitive adhesive (PSA) may be used for the non-conductive layer. Not only does this PSA provide a non-conductive layer, but it also provides a moisture barrier for the composite material, and may provide a simple way to remove the DW bus 204 in the future if for some reason it needed to be repaired or replaced.

Figure 3:
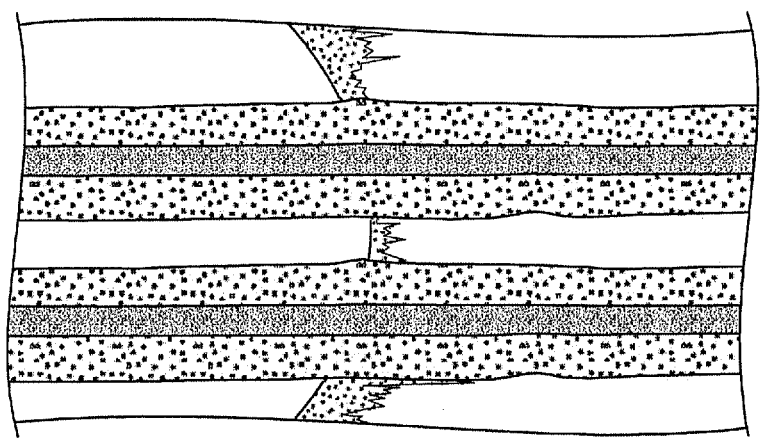
FIG. 3 shows shorted traces due to melted Plasma Flame Spray (PFS) powder.

An experiment was performed in order to determine whether the methods described above would be successful. Two copper-coated Kapton flexible circuits were bonded to either end of two composite plates. Parallel metallic traces were patterned over the flexible circuits using DW methods: PFS using copper, and JAD using silver. Positive results were noted. In particular, nothing melted and the traces appeared to follow the layers without a problem. Additionally, there was good electrical continuity, and there appeared to be no mechanical problems. However, during the PFS process, metallic powder floated around and tended to stick where there was a gap, seam, or step on the composite plate (including superficial lines in the plate itself, at the interface with the non-conducting film, and at the Kapton and copper steps). In some regions of the plate this powder could just be brushed away. However, at the interface with the flexible circuit, near where the PFS head traveled in order to write DW traces, this powder actually melted and formed a thin conductive path that could not be easily cleaned and shorted the parallel traces together, seen in FIG. 3. This is not an insurmountable problem, but it should be taken into account when applying traces in this manner.

In a particular embodiment, the communication and sync traces should match a prescribed impedance to daisy-chain multiple sensors on a common bus. Additionally, the power line traces should have enough area to carry the specified current. Also, each of these traces should have low enough resistance to allow the signals to be carried along the desired total length for SHM coverage. Further, shield layers should be sized to provide desired protection without interfering with bus functionally. In particular embodiments, two different DW techniques, PFS and JAD, are used to form a DW bus. PFS may use copper as a conductor and can pattern traces from about 0.3-1.5 mm wide (±50 μm) by about 0.05-1 mm thick (±10 μm) with approximately a 2 mm pitch. JAD may use silver nano-particle ink as a conductor and can pattern traces from about 0.1-0.3 mm wide (±5 μm) by about 3-10 μm thick (±1 μm) with approximately a 0.1 mm pitch. Both PFS and JAD can be compatible with various spray-on epoxy insulators.

In a particular embodiment, the PFS technique discussed above may be used to meet geometry constraints of the power line traces (also referred to herein as "power traces" or "power lines"). Design of the power traces according to a particular embodiment and experiments used to validate these designs are discussed below.

Voltage carrying capacity may be proportional to trace pitch, and current carrying capacity may be proportional to trace cross-sectional area. Two documents that provide guidance regarding design for current and voltage are MIL-STD-275E, "Printed Wiring for Electronic Equipment" and IPC-2221 "Generic Standard on Printed Board Design," both of which are incorporated herein by reference in their entirety. From Table I in 4A of MIL-STD-275E and Table 6-1 in the IPC-2221 standard, the power trace spacing should be about 0.1 mm for up to 50 VDC assuming a Type A5 assembly of external conductors with conformal coating. Similarly, from FIG. 4A in MIL-STD-275E and FIG. 6-4 in the IPC-2221 standard, the minimum power trace cross sectional area to carry 3.5 A with a factor of safety of 2 would be about 0.16 mm^2 assuming similar behavior to external etched copper conductors.

Figure 4:
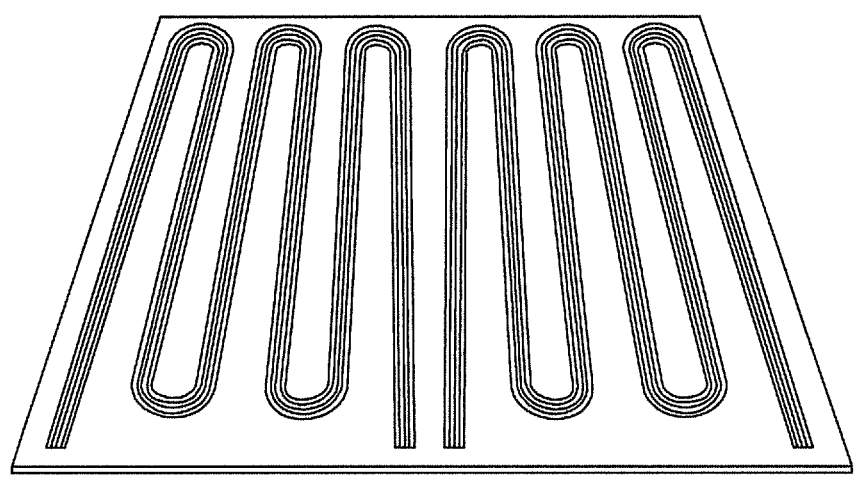
FIG. 4 shows meandering PFS traces on a carbon fiber reinforced plastic (CFRP) plate.

To validate these calculations for power traces applied using PFS, three sets of parallel copper traces with a 2.5 mm pitch were deposited on a 75×75 cm square graphite/epoxy plate in a meandering pattern with a total length of about 5 m, as seen in FIG. 4. The first set of traces measured slightly below the minimum theoretical area at about 0.1 mm^2, the second set of traces was just above the minimum area at about 0.2 mm^2, and the third set of traces was approximately twice the minimum area at about 0.3 mm^2. A 40 VDC, 15 ADC power supply was connected to each pair of traces, and the current was measured with a multimeter. All sets of traces successfully carried 40 VDC and 9.5 ADC for over 5 minutes without any indication of failure.

There may be a limitation on total length of power traces for a given resistivity, because as the resistance gets too high the voltage seen by the last node in the sensor-bus may drop below a 24 V threshold expected by the sensor nodes for excitation. To calculate the total allowable length, the SHM system was treated as a large circuit diagram. The 100 nodes were modeled as constant power dissipation sinks, with 93 consuming 0.8 W while in standby, and 7 nodes consuming 3 W while sensing. Each power trace between nodes was modeled as a small resistor. Then, setting the input voltage to 28 Vpp, Kirchhoff's laws could be used to solve for the maximum tolerable power trace resistivity. For the preliminary design, a node spacing of ½ m was selected, as well as copper traces with a conductivity equal to 58×106 S/m (IACS at 20° C.). Using these assumptions, the equations indicate a minimum cross-sectional area of 1 mm^2

To determine the conductivity of the PFS traces, the resistance of the traces and the geometry were measured from the plate described in FIG. 4. The electrical conductivity is related to the trace resistance by $R = L/(\sigma \times A)$, where R is the resistance, L is the trace length, A is the trace cross sectional area, and σ the electrical conductivity. Using this equation, the measured electrical conductivity averaged 17×106 S/m for the largest set of traces, 13×106 S/m for the middle set of traces and 8×106 S/m for the smallest set of traces. These values are low compared to the copper standard, with differences likely due to impurities, as well as geometry assumptions, since conductivity seems to decrease with increasing geometry. The consequence of this lower conductivity value may be that: fewer nodes can exist on the bus as designed, the nodes may be spaced closer together, or the traces may be re-sized.

Various embodiments of cable-free digital sensor systems may use different communications protocols, such as USB, Ethernet and FireWire. In a particular embodiment, a controller-area network (CAN) protocol may be used for communications. The CAN protocol may be advantageous since a) it is relatively high-speed, b) it has a serial architecture, and c) it has a forgiving network topology. For example, by allowing a range of impedance values from about 100-130 Ohms, along with good error handling, the CAN protocol may be less sensitive to inconsistencies and tolerances for fabricated traces than some other communication protocols. The CAN protocol is governed by ISO 11898, is a mature protocol with more than 20 years of in-service applications, and is designed to allow devices to communicate without a host PC. It has a maximum transmission speed of 1 Mbit/sec for theoretically up to 2032 devices over 1,000 m.

To design the communication traces, a Spice simulation model was constructed using measured values for copper and CAN controller elements for each of the SHM nodes in the network. A single high/low CAN pulse pair was input into the traces on one end, and the differential voltage was displayed for the final node in the network. Impedance may be an important parameter for digital communication. The impedance of a trace is a complex function of trace width, trace spacing, trace thickness, shield spacing, conductivity and dielectric constant for the insulation between the communication traces and the shield layers.

Initial iterations determined that the communication traces should be about 0.25 mm by about 10 μm thick with approximately a 0.5 mm pitch. This is finer than PFS techniques are typically capable of depositing. PFS techniques may be used to make thick enough lines for power traces but may have positional tolerances that are not adequate for communication lines. However, the pitch capabilities of PFS may be improved through the use of a 2D gantry or etching process to remove material from a bulk trace (as opposed to an additive process). Also, hardware changes could be made that may reduce conductivity constraints. For example, a CAN repeater may be integrated within the sensor hardware to boost the signal approximately every meter, which could reduce conductivity needs.

JAD techniques may be used accurately for controlled impedance, but only very thin lines can be made, which may not be suitable to carry power. Accordingly, a hybrid approach may be used to form a cable-free digital sensor bus. JAD may be used to apply the communication traces and PFS may be used to apply power traces. A plate similar to the one shown in FIG. 4 was fabricated using JAD to measure the conductivity of the silver nano-ink particles. While JAD was capable of achieving the specified geometry of the communication traces, the measured resistance values of traces formed using JAD were 3 orders of magnitude higher than desired for a 100 node system, approximately 1 kOhm per a 60 cm trace that should be less than 1 Ohm. The increased resistance values appear to be related to the relatively thin traces characteristic of present JAD techniques. Accordingly, while it is believed that JAD methods will enable greater thickness traces to be applied eventually, for testing purposes a screen printing process was developed for silver epoxy using chemical etched steel-shim templates. By using this screen printing process, thicker silver traces can be patterned than with the tested JAD processes. Also, a finer pitch can be patterned than with current PFS methods.

Based on testing, it was determined that the silver epoxy traces should be at least 125 µm thick. The Spice model was updated to yield 0.33 mm wide traces with a 1.5 mm pitch. The synchronization traces may have an identical geometry to the communication traces as they have the same characteristic impedance range using RS-422.

As discussed above, shield layers mainly serve to protect the communication traces and the sync traces from electrical and mechanical interference (EMI). However, digital signals may be less susceptible to noise than analog signals, particularly in differential mode. Guidelines indicate that even a minimal amount of metal, such as 1 µm layer, may be a suitable shield for digital signals against electrical interference up to 1 MHz. Magnetic interference may be harder to transmit and harder to protect against. Using a 10 µm layer of metal may provide some protection against magnetic interference up to 1 MHz; however, this layer may either be significantly thicker or make use of a magnetic field absorbing material in order to provide better protection.

Beyond EMI, the shield layers may also play a role in CAN impedance calculations. If in-plane and out-of-plane shield layers are placed far enough away from the communication traces, they may have little influence. However, in a system designed for minimum overall weight and cross-sectional area, it may not be acceptable to space the layers far enough from the communication traces to reduce their influence. In this arrangement, as long as the in-plane shield traces have a pitch equal to or greater than the communication traces, the in-plane shield traces may have negligible effect. The out-of-plane shield traces may play a major role in the impedance within reasonable geometry. Thus the out-of-plane shield traces may be designed to be about 0.5 mm above and below the communication traces. The remaining volume between the communication traces and sync traces, and the out-of-plane shield traces may be filled with a dielectric material.

Another concern of electrical design of the bus may be selection of the dielectric material to electrically isolate all of the conductors. PFS techniques may be compatible with a variety of ceramic insulators that offer good dielectric values. However, stiffness of these ceramic insulator materials may not be desirable. JAD techniques may be compatible with several UV-curable epoxies that provide good stiffness. However, there may be manufacturing difficulties with fabricating thick UV-cured sections. Accordingly, for testing purposes, a simple spray-on epoxy method was used to apply electrically insulating layers in a cost-effective manner while still achieving the desired system characteristics. A dielectric was selected that: a) had a dielectric constant of about 3 between 10 kHz and 1 MHz (ASTM D-150), b) had a service temperature of at least about 250° C. to survive a subsequent PFS process, c) had a room temperature cure cycle to reduce the effect of mismatched thermal expansion coefficients, and d) had a viscosity suitable for spraying. Multiple epoxies were procured that met these criteria at a range of viscosities for experimental validation of the manufacturing process and testing of the dielectric constant of each material. Actual dimensions of these insulating layers were selected based on the conducting layer designs.

Figure 5:
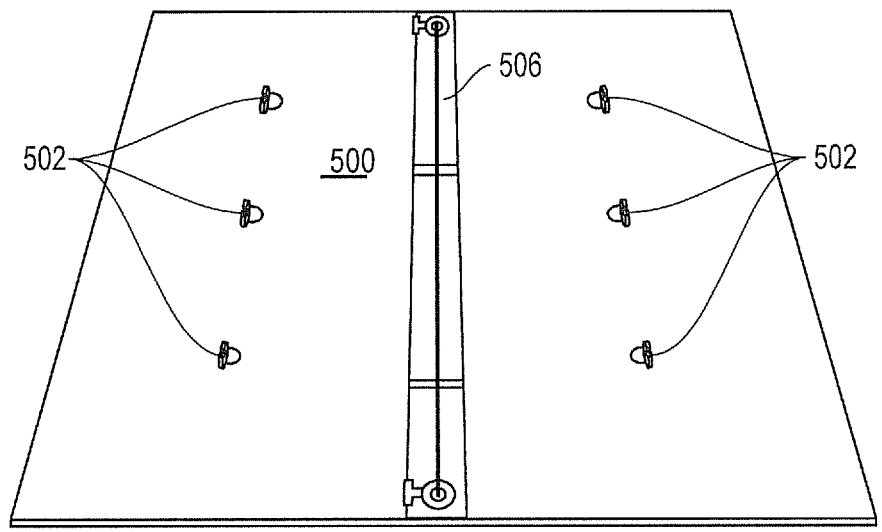
FIG. 5 shows a plate used to evaluate SHM compatibility.

There was some concern during design that the presence of the DW traces would create guided wave (GW) scatter points, causing changes in signal phase and amplitude. To evaluate this concern, two carbon fiber reinforced polymer (CFRP) plates 500 measuring 75×75 cm by 2.5 mm thick were instrumented with three pairs of sensor nodes 502 bonded on opposite ends of a pair of DW traces 506, as seen in FIG. 5. The first plate used copper traces applied via PFS and representative of the designed power lines. The second plate used traces applied using JAD and representative of the communication traces and sync traces. The sensor nodes 502 included actuator and sensor pairs with a concentrically placed lead zirconium titanate (PZT)-5A washer and disc. The actuator was a ring with outer and inner diameters of 0.5 inches and 0.29 inches, respectively, while the sensor had a diameter of 0.25 inches. Both the actuator and the sensor had a thickness of 0.75 mm. Each sensor node 502 can function both in the "pulse-echo" and "pitch-catch" modes. In the "pulse-echo" mode, the actuator is excited with a short time-span burst signal and the sensor in the same pair is used to sense Lamb-wave reflections caused by the burst from damage zones near the sensor node 502. In the "pitch-catch" mode, one or more sensors are used to record the response of the structure to excitation by an actuator at some distance from the sensors. The sensor nodes 502 were connected to an Agilent 33220A function generator for the actuator, and the sensor signal was recorded using an oscilloscope. Both pitch-catch and pulse-echo measurements were collected before and after the application of DW traces.

Baseline data for the first plate was collected over a range of frequencies (from about 50 to 500 kHz in steps of 50 kHz) before the traces were deposited. Subsequently, data was collected for the same range of frequencies after the PFS power traces were applied. The signals were filtered using a zero-phase, high-order Butterworth filter to eliminate high and low frequency noise outside the excited bandwidth. This was followed by a Hilbert transform to extract the pitch-catch signal envelope.

Figure 6:
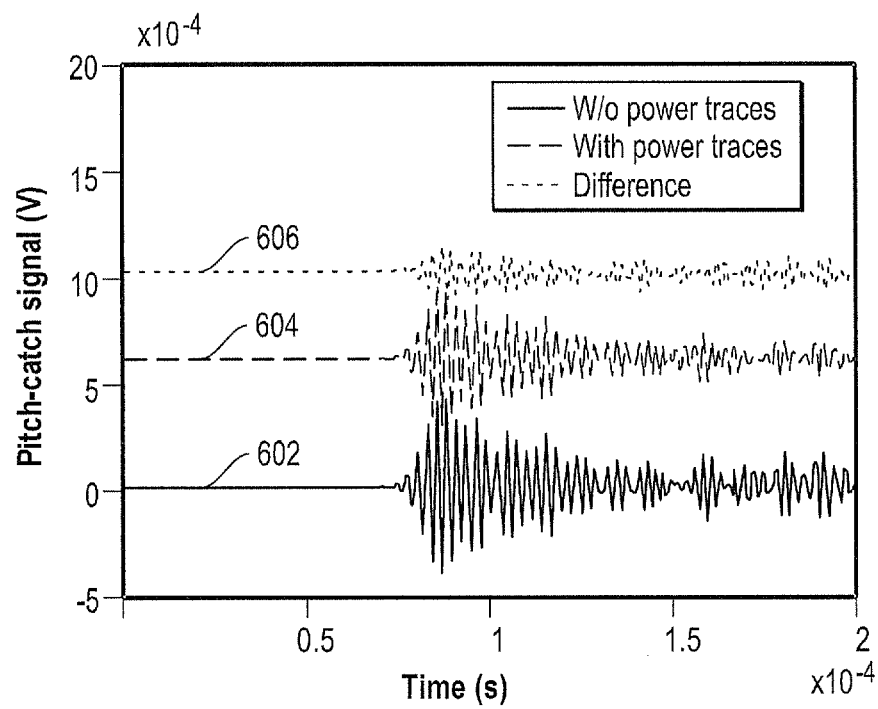
FIG. 6 shows signal traces of a pitch-catch test with and without PFS.

A sample of the results is shown in FIG. 6 for a path between the two central sets of sensor nodes. As seen in FIG. 6, there is an observable difference 606 in the pitch-catch signal transmitted across the power traces 604 as compared to the pitch-catch signal transmitted without the power traces 602. However, the difference is largely a result of some attenuation in signal amplitude rather than shape/phase. This is reflected in the values of the two metrics used to quantify this change, the signal amplitude metric and the signal correlation metric. The signal amplitude metric is indicative of the combined amplitude and phase change, whereas the signal correlation metric is insensitive to signal amplitude changes. The average values of the two metrics across the path between the central sensor node pairs at the tested frequencies was tabulated. A larger drop in the amplitude metric (average of 26%) in comparison to the correlation metric (average of less than 2%) indicated that there was some attenuation of the signal transmitted across the power traces, but no significant change in signal shape. Similar trends were observed for the other pitch-catch paths.

Figure 7:
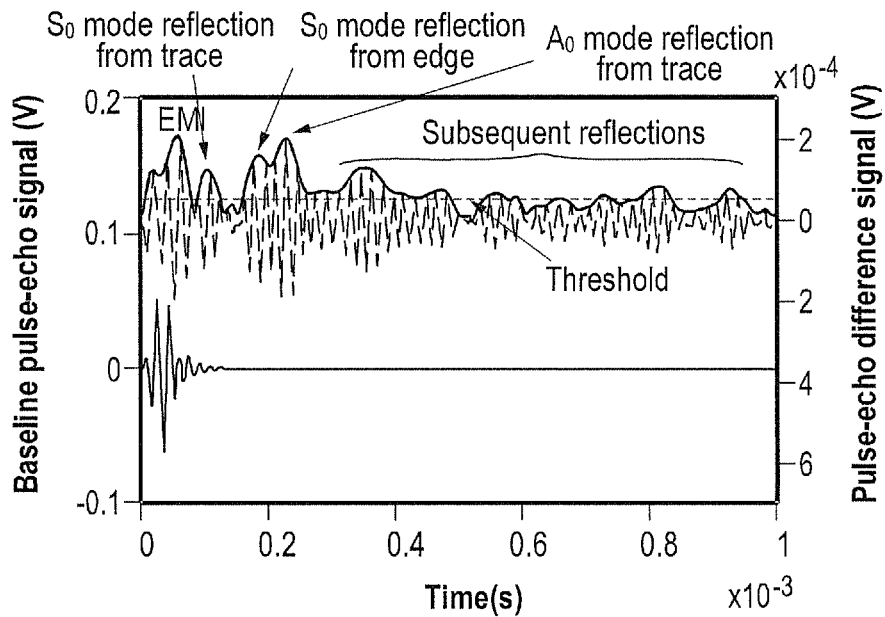
FIG. 7 shows signal traces of a pulse-echo difference for PFS traces.

The power traces also caused a small but detectable reflection in pulse-echo signal when the difference between the signals taken before and after the deposition of the power traces is examined, shown in FIG. 7. Based on these reflections (which include both possible modes, i.e., the zero-order symmetric (S0) and antisymmetric (A0) modes) the power traces can be located relative to the nodes. For example, from the signals in FIG. 7, and the wave speeds for the two modes at 50 kHz determined from the baseline pitch-catch signals, the location of the power traces relative to the sensor node is 18.2 cm, which is 18 mm from the actual location. Thus, while there is some effect on the Lamb-wave signals when compared before and after the deposition of the power line traces, this may be largely a wave attenuative effect and should not be expected to affect SHM performance.

The capability of the sensor nodes to detect damage with the power traces deposited on the panel was also separately evaluated. Based on the initial tests, a lower frequency of 30 kHz was chosen for the damage detection tests. Multiple baseline pulse-echo signals were collected to examine signal repeatability for the first plate (with the power traces) and to obtain threshold values. The signal repeatability was not adversely affected and threshold values were consistent with those observed before the power traces were deposited. A cylindrical magnet 12.7 mm in diameter by 6 mm tall was first placed half-way between a sensor node and the power traces, and then half-way between the power traces and a sensor on the oppose side.

Figure 8:
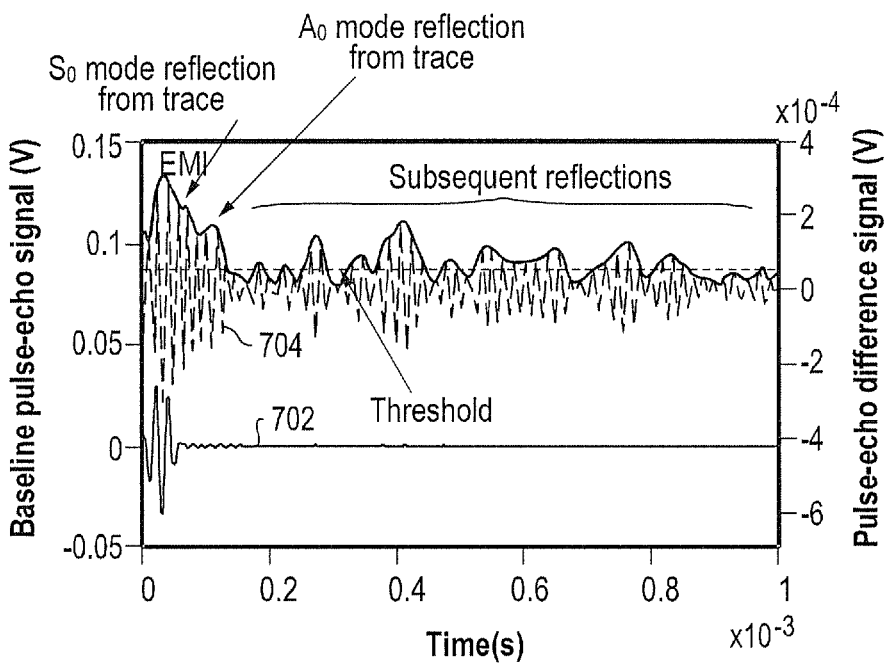
FIG. 8 shows signal traces of a pulse-echo with a magnet in a near position.

During a first test, a clear reflection from the magnet is discernible above the threshold, as seen in FIG. 8. At this lower frequency, the A0 mode reflection dominates much more strongly than the S0 mode reflection, which is not discernible above the threshold. Based on the A0 mode reflection and using wave speeds estimated from pitch-catch tests, the magnet's location was estimated to be 9.7 cm, which is 2.5 mm from the actual position. Based on this result and the amplitude of the pulse-echo difference signal over the threshold seen in FIG. 8, a range of each node is estimated to be a circular region with radius of approximately 40 cm for this particular plate. Note that this estimate is independent of the presence of the power line trace, since the magnet is on the near side of the trace, relative to the sensor node.

Figure 9:
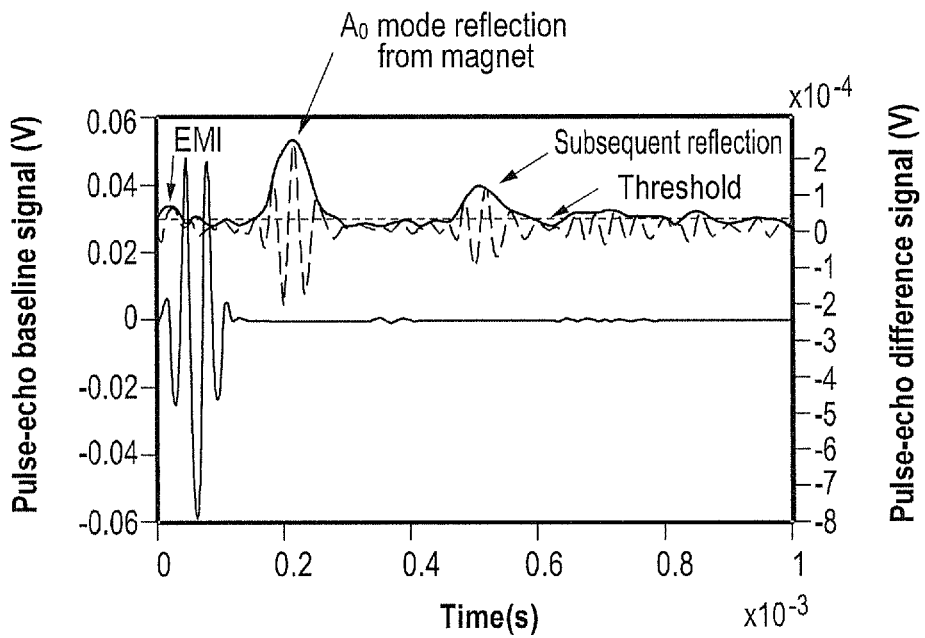
FIG. 9 shows signal traces of a pulse-echo with a magnet in a far position.

Next, to evaluate whether damage can be detected if it is located beyond the power traces, the magnet was placed in a second position. Signals from this test are shown in FIG. 9, with a reflection from the magnet still appearing above the threshold value. Based on the A0 mode reflection, the magnet's location was estimated to be 31.2 cm, which is only 5 mm from the actual position. Thus, the range estimate of the nodes from the earlier test is justified. This range is also consistent with prior tests performed on similar CFRP panels using similar sensor nodes.

While there was some effect on the Lamb-wave signal amplitude due to the power traces when the signals before and after the DW process were compared, the signal shape is not significantly affected. In particular, the ability for this method to detect and localize damage was not compromised, as confirmed by the described test results using magnets to simulate damage. In addition, the range of this method from each sensor node was not significantly changed by the presence of the power traces.

Figure 10:
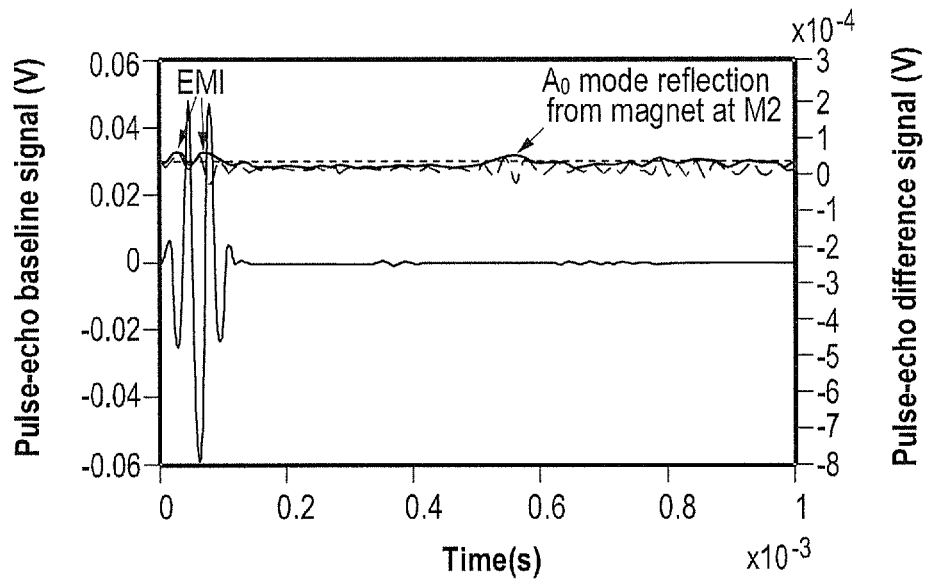
FIG. 10 shows signal traces of a pulse-echo difference for Jetted Atomized Deposition (JAD) traces.

Once it was established that the power traces would not adversely affect damage detection, there was confidence that the other traces would have even less of an effect since they were all significantly smaller with less deposited material. Nevertheless, for completeness a similar test matrix was conducted for the second plate with the communication and sync traces applied using a JAD technique. Like the tests on the first plate, a difference was observed in comparing results with and without the silver communication and sync traces. In this case, however, the amplitude metric had a much smaller change (average of 8.9%) and the correlation metric had nearly no change (average of 0.6%). Similar changes were observed for the pulse-echo results. From the pulse-echo response illustrated in FIG. 10, and the wave speeds for the two modes at 50 kHz determined from the baseline pitch-catch signals, the location of the trace relative to the central sensor node was 1.4 cm, which is 2.5 mm from the actual position.

One reason why neither sets of traces may have had a large effect on the wave propagation is due to a mitigation technique that was employed. From prior research it has been determined that placing a thin polymer layer (about 125-250 μm) under potential wave scattering points can decouple these features from the wave propagation path. The low stiffness of the thin polymer layer compared to the plate structure, the acoustic impedance mismatch, and the damping properties of the thin polymer layer together may "hide" the stiffness of other features bonded above the thin polymer layer as the wave travels underneath, so long as the thin polymer layer is thick enough. In this case, a 125 μm thick PEEK pressure sensitive adhesive (PSA) was selectively applied to the plates prior to the DW processes. The PSA also prevented the traces from shorting out on the conductive graphite fibers of the plates, and provided a moisture barrier for the CFRP material. Furthermore, peeling the PSA and the traces on the PSA off of the plates may provide a simple way to remove the DW bus if for some reason it needed to be repaired or replaced.

In a particular embodiment, one challenge with implementing a cable-free digital sensor bus is integration of all of the system elements into a complete design. A balance may be struck between maintaining the optimized component characteristics and reducing overall bus geometry and mass. Additionally, consideration may be given to selecting appropriate manufacturing processes so that the designed configuration can be fabricated. An embodiment of a final configuration can be seen in FIG. 11 (not to scale).

Figure 11:
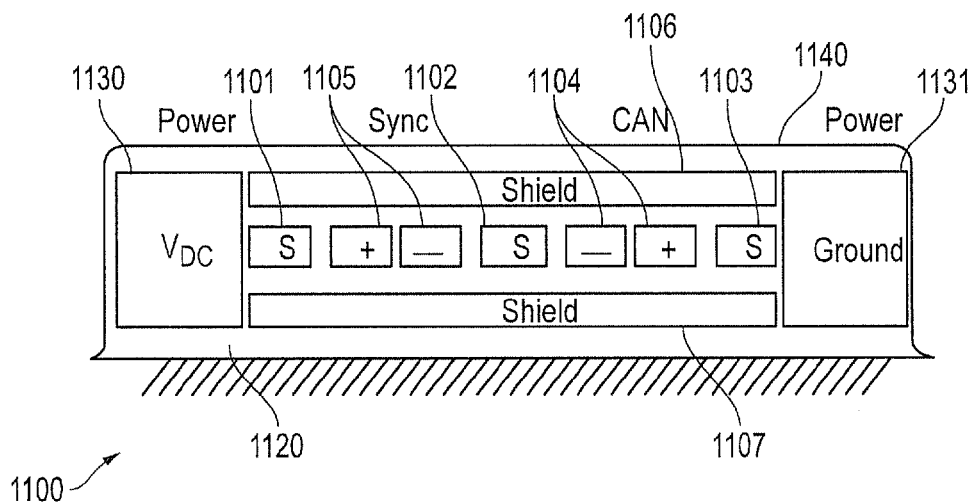
FIG. 11 shows a schematic of a final integrated configuration.

In the design illustrated in FIG. 11, each of the shield (S) traces 1101-1103, the communication traces ("CAN") 1104 (+/−) and the sync (+/−) traces 1105 may be about 330 μm wide by about 125 μm thick with approximately a 1.5 mm pitch. Top 1106 and bottom 1107 shield layers of about 10 μm thick may surround all of these traces with approximately a 1 mm pitch. An epoxy 1120 may fill in gaps between the traces 1101-1105 and the shield layers 1106-1107 to maintain their relative placement and to provide electrical insulation. A power trace 1130 and a ground trace 1131 may be placed on either side of a communication/sync stack including the communication traces 1104 and sync traces 1105. The power and ground traces 1130-1131 may be about 1.25 mm wide by about 0.4 mm thick, with approximately a 12 mm effective pitch. An encapsulant 1140, such as a urethane, may be applied over the entire assembly. In this arrangement, overall dimensions of the bus 1100 are approximately 1.35 cm wide by approximately 1.25 mm thick, with a weight of around 25 g per meter of length. Thus, the entire weight of the benchmark system previously described would be about 2.5 kg for the cable-free digital sensor-bus and about 0.5 kg for the sensors.

Figure 12:
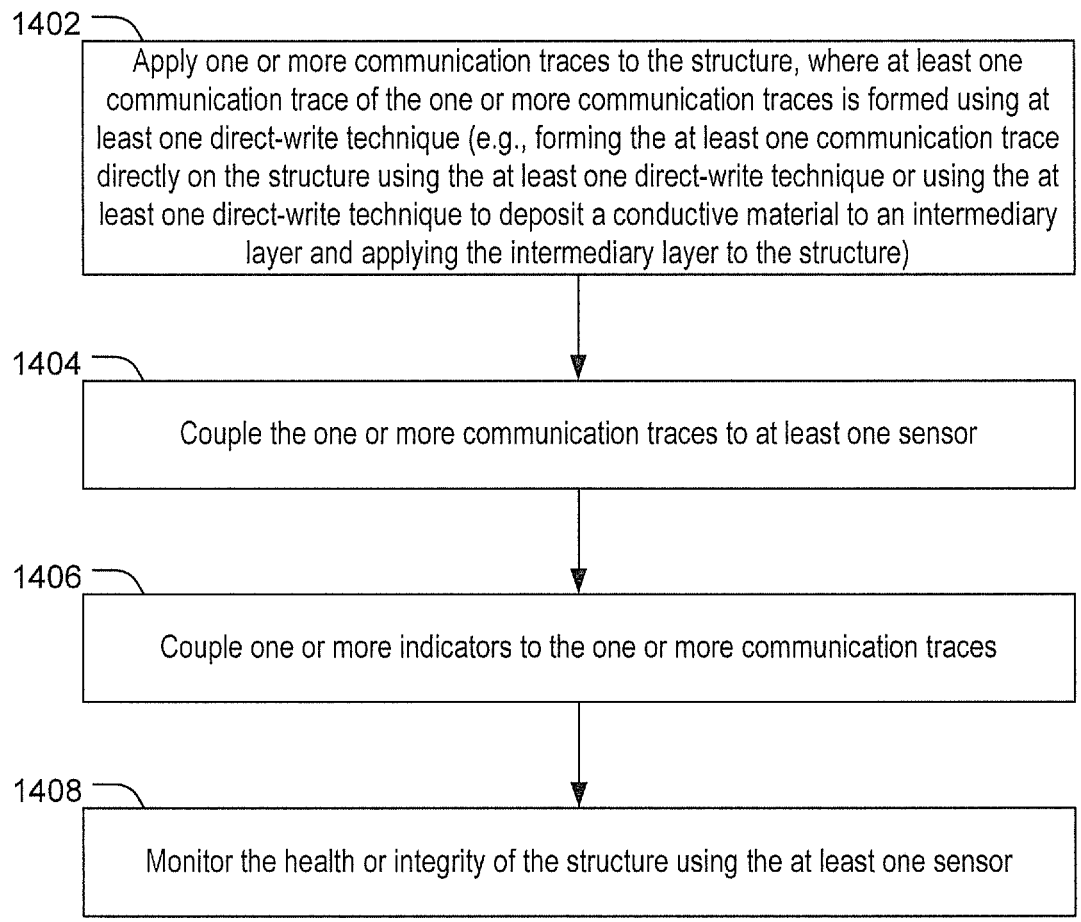
FIG. 12 is a flow chart of a first embodiment of a method of fabricating a bus.

FIG. 12 illustrates a flow chart of a first particular embodiment of a method of fabricating a bus. The method includes, at 1402, applying one or more communication traces to the structure. At least one communication trace of the one or more communication traces may be formed using at least one direct-write technique. For example, the at least one communication trace may be formed directly on the structure using the at least one direct-write technique. In another example; the at least one direct-write technique may be used to deposit a conductive material to an intermediary layer, and the intermediary layer may be applied to the structure.

In a particular embodiment, the one or more communication traces are formed in a plurality of layers separated by a dielectric material. The dielectric material may be applied using the at least one direct-write technique. For example, at least two of the plurality of layers may be layers of a sprayed-on or painted-on conductor separated by the dielectric material. The at least one direct-write technique may include a deposition process, a spray process, a printing process, or another process. In a particular embodiment, two or more direct-write methods are used to apply the one or more communication traces. In a particular embodiment, the one or more communication traces are embedded within a surface of the structure.

The method also includes, at 1404, coupling the one or more communication traces to at least one sensor. The at least one sensor may include a first sensor and a second sensor. The first sensor and the second sensor may be of different types or of a same type. To illustrate, a first sensor may include an actuator to generate a waveform used to test the structure, and a second sensor may include a sensor to detect the waveform.

The method may also include, at 1406, coupling one or more indicators to the one or more communication traces. The method may further include, at 1408, monitoring the health or integrity of the structure using the at least one sensor.

Figure 13:
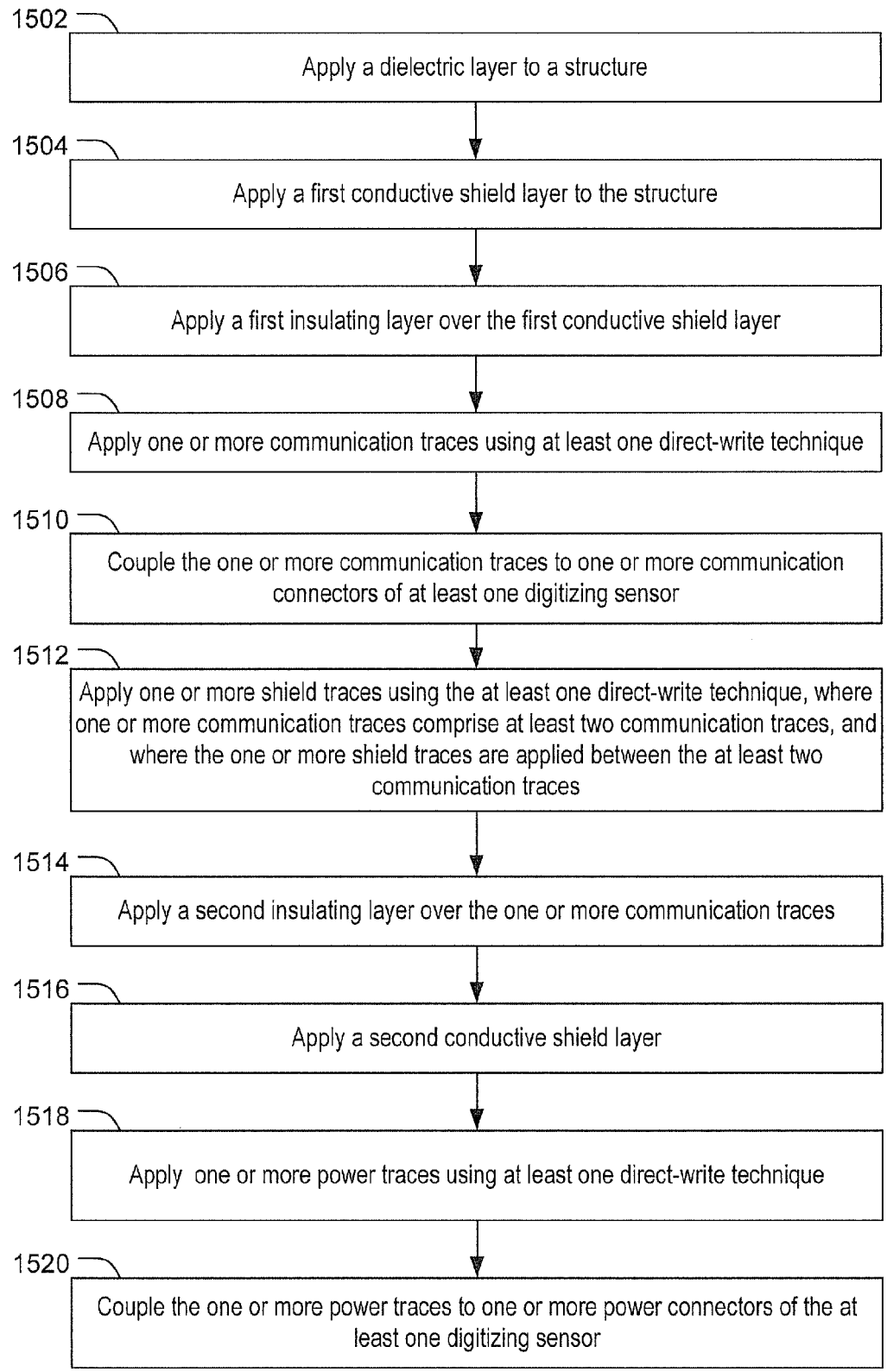
FIG. 13 is a flow chart of a second embodiment of a method of fabricating a bus.

FIG. 13 illustrates a flow chart of a second particular embodiment of a method of fabricating a bus. The method includes, at 1502, applying a dielectric layer (such as, a pressure sensitive adhesive) to a structure. The dielectric layer may be applied to an area where the bus is to be formed on the structure. The surface of the structure may be treated before the dielectric layer is applied. For example, the surface of the structure may be plasma treated, abraded, bead blasted, or treated using another technique to improve adhesion of the dielectric layer to the surface.

The method may also include, at 1504, applying a first conductive shield layer to the structure. For example, the first conductive shield layer may be applied over the dielectric layer. A first insulating layer may be applied over the first conductive shield layer, at 1506.

The method may include, at 1508, applying one or more communication traces using at least one direct-write technique. The one or more communication traces may include at least one synchronization trace. The at least one direct-write technique may include spraying or painting on a material that forms a conductor. In other examples, the at least one direct-write technique may include a plasma flame spray technique, jetted atomized deposition technique, another printing or deposition process that applies a conductive material, or any combination thereof. The one or more communication traces may be coupled to one or more communication connectors of at least one digitizing sensor, at 1510. In a particular embodiment, the at least one direct write technique is used to form the one or more communication traces over the one or more communication connectors. For example, the one or more communication connectors may be applied (e.g., bonded or adhered) to the surface of the substrate, and the one or more communication traces may be written directly over the one or more communication connectors.

In a particular embodiment, the one or more communication traces include at least two communication traces, and the method includes, at 1512, applying one or more shield traces to the structure using the at least one direct-write technique. The one or more shield traces are applied between the at least two communication traces. In an illustrative embodiment, the one or more communication traces and the one or more shield traces may be formed substantially simultaneously. To illustrate, the at least one direct write technique may be used to form the one or more communication traces and the one or more shield traces at the same time. For example, a template or mask may be used to guide painting, spraying or screen printing of the one or more communication traces and the one or more shield traces at the same time.

After the one or more communication traces are applied, the method may include, at 1514, applying a second insulating layer over the one or more communication traces. A second conductive shield layer may be applied over the one or more communication traces, at 1516.

The method may include, at 1518, applying one or more power traces to a structure using at least one direct-write technique. In a particular embodiment, the one or more communication traces are applied using a first direct-write technique and one or more power traces are applied using a second direct-write technique that is different than the first direct-write technique. The method may also include, at 1520, coupling the one or more power traces to one or more power connectors of the at least one digitizing sensor.

In a particular embodiment, the method may be performed remote from the structure. For example, the one or more communication traces, the one or more synchronization traces, the one or more shield traces, the conductive shield layers, the one or more power traces, the insulating layers, or any combination thereof may be formed on an intermediate layer. Subsequently, the intermediate layer may be applied to the structure. For example, the intermediate layer may include the dielectric layer formed on a temporary substrate, such as a release paper.

A particular embodiment of a fabrication method to form a cable-free digital sensor system, such as the cable-free digital sensor bus described with reference to FIG. 11 or the benchmark system, is described below. A series of multiple DW and spray operations may be used according to a particular embodiment.

Figure 14:
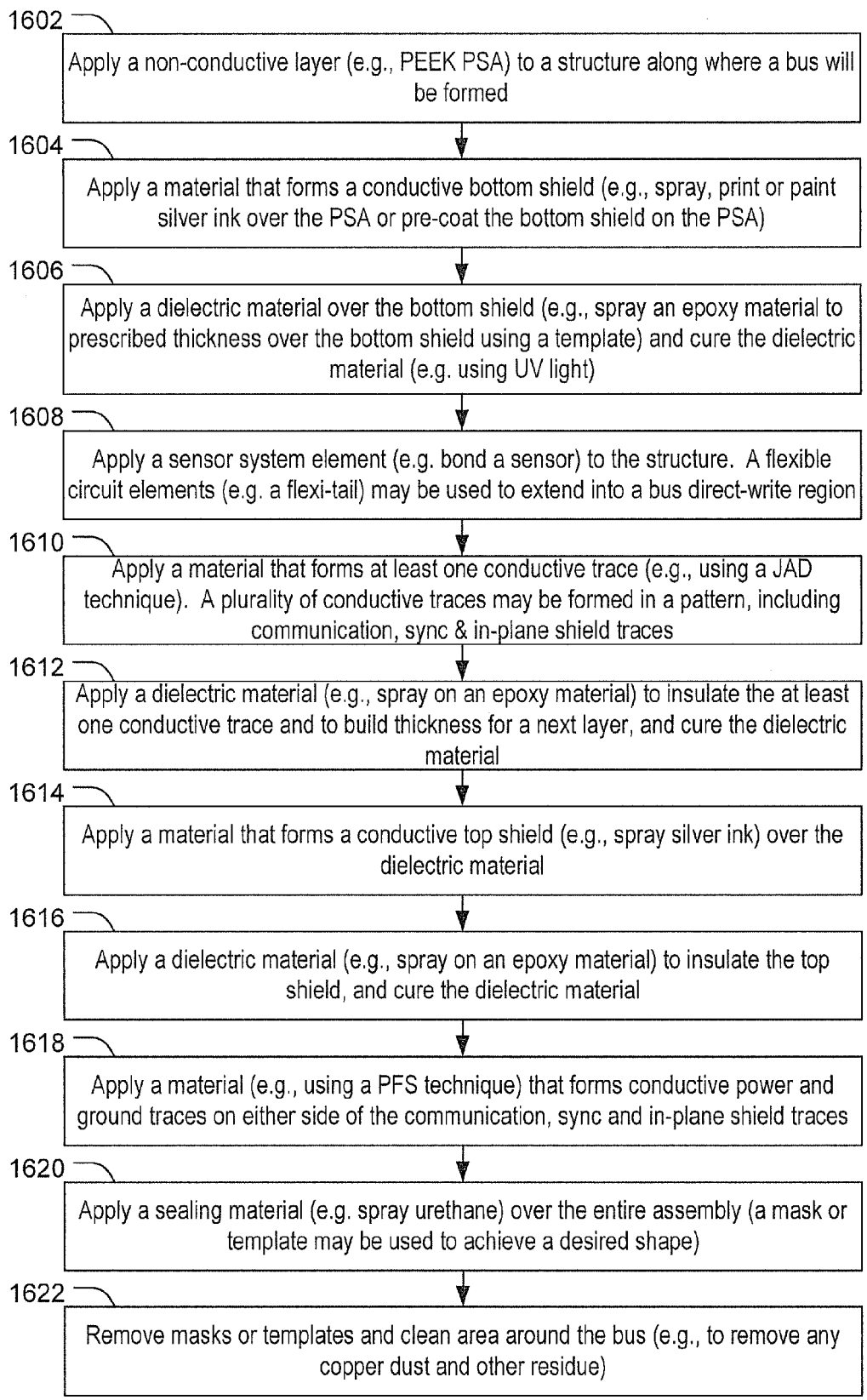
FIG. 14 is a flow chart of a third embodiment of a method of fabricating a bus

The fabrication method is illustrated in FIG. 14 as a flow chart of a third particular embodiment of a method of fabricating a bus. The method includes, at 1602, applying a non-conductive layer, such as a polyether ether ketone (PEEK) pressure sensitive adhesive (PSA) in an area where a bus will be laid. The method also includes, at 1604, applying a material that forms a conductive bottom shield layer. For example, a silver ink may be sprayed over the PSA. In yet another example, the silver ink or another material that forms a conductor may be painted or deposited on the PSA. To illustrate, a printing technique, such as screen printing or Gravure printing, may be used to apply the material to form the conductive bottom shield layer. In another example, the bottom shield layer may be pre-coated on the PSA.

The method also includes, at 1606, applying a dielectric material over the bottom shield layer. For example, an epoxy material may be sprayed to a prescribed thickness over the bottom shield layer using a template. The epoxy material may be cured (e.g. using ultraviolet light). The method may also include, at 1608, applying a sensor system element to the structure. For example, a sensor node may be bonded to the surface. In another example, a sensor node or another sensor system element may be formed on the structure using a direct-write technique. A flexible circuit element, such as a flexi-tail, may be used to extend from the sensor system element into a bus direct-write region.

The method may also include, at 1610, applying a material that forms at least one conductive trace. For example, a JAD technique may be used to apply the material to form the at least one conductive trace. In a particular embodiment, a plurality of conductive traces may be formed in a pattern. The plurality of conductive traces may include communication traces, sync traces, in-plane shield traces, or any combination thereof. The at least one conductive traces may be applied at a location approximately centered in the bus direct-write region (i.e., an area where the bus is to be formed).

The method may also include, at 1612, applying a dielectric material to insulate the at least one conductive trace and to build thickness for a next layer. For example, an epoxy material may be sprayed over the at least one conductive trace. The epoxy material may be cured, e.g., using ultraviolet light.

The method may also include, at 1614, applying a conductive material over the dielectric material to form a top shield. In a particular embodiment, the top shield may be formed using the same techniques used to form the bottom shield. For example, a silver ink may be sprayed to form the top shield.

The method may also include, at 1616, applying a dielectric material (e.g., epoxy) over the top shield. A mask or template may be used to contain a width of the dielectric material. The dielectric material may be cured, e.g. using ultraviolet light.

The method may also include, at 1618, applying a conductor to form power and ground traces. For example, the power and ground traces may be formed using a plasma flame spray technique. In a particular embodiment, the power and ground traces may be deposited on either side of the communication, sync and in-plane shield traces.

The method may also include, at 1620, applying a sealing material over the entire assembly (i.e., the power and ground traces, communication traces, synchronization traces, in-plane shield traces, top shield, bottom shield and dielectric layers). A template may be used to achieve a desired shape. The sealing material may include a urethane material or another dielectric material.

The method may also include, at 1622, removing all masks and templates used to form the bus. An area around the bus may also be cleaned (e.g., to remove any copper dust or overspray of various materials).

Figure 15:
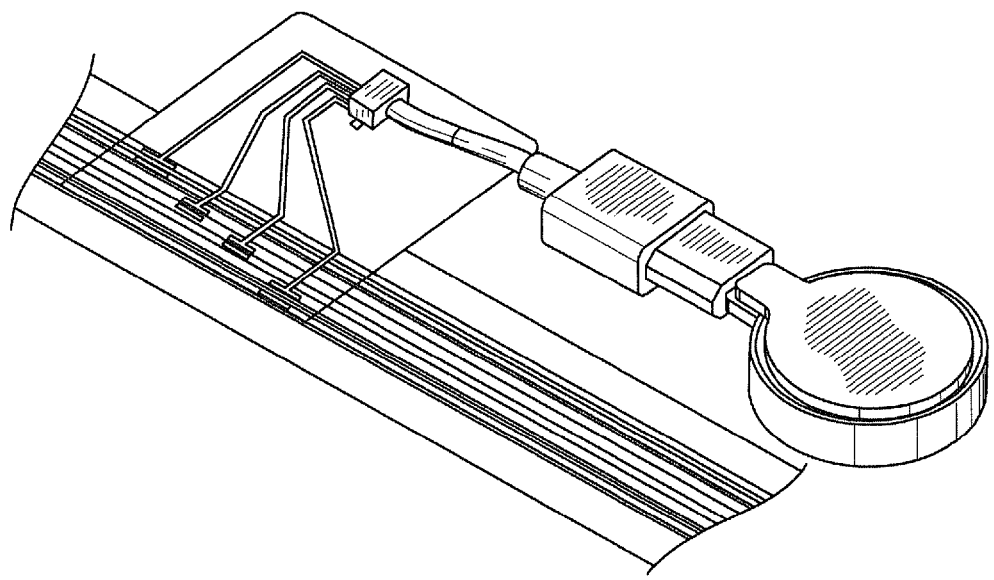
FIG. 15 shows a schematic of a test implementation.

For testing purposes, some deviations from the above specified manufacturing process were used to accommodate available resources. Firstly, available sensor nodes were used to evaluate the digital sensor-bus. The available sensor nodes used FireWire connectors for power and CAN communications. The FireWire connector was not directly compatible with the designed cable-free digital sensor bus. Therefore, an adapter was designed for the flex-tail of the sensor nodes, as illustrated in FIG. 15. The adapter enabled connection of the sensor node to the cable-free sensor bus by overwriting the adapter leads using DW processes; however, rather than connecting the adapter directly to the digital sensor node through a board connector, a small portion of the FireWire cable was crimped into a reciprocal board connector that was then plugged into the sensor node. Secondly, a silk-screen process was used rather than a JAD process to apply the communication, sync and in-plane shield traces. The silk-screen process filled in a chemical-etched steel shim with silver epoxy. Additionally, since the silver traces were applied manually, only the communication lines were laid down to demonstrate system functionality at lower risk. FIG. 15 illustrates a schematic diagram of a particular embodiment as described above.

Figure 16:
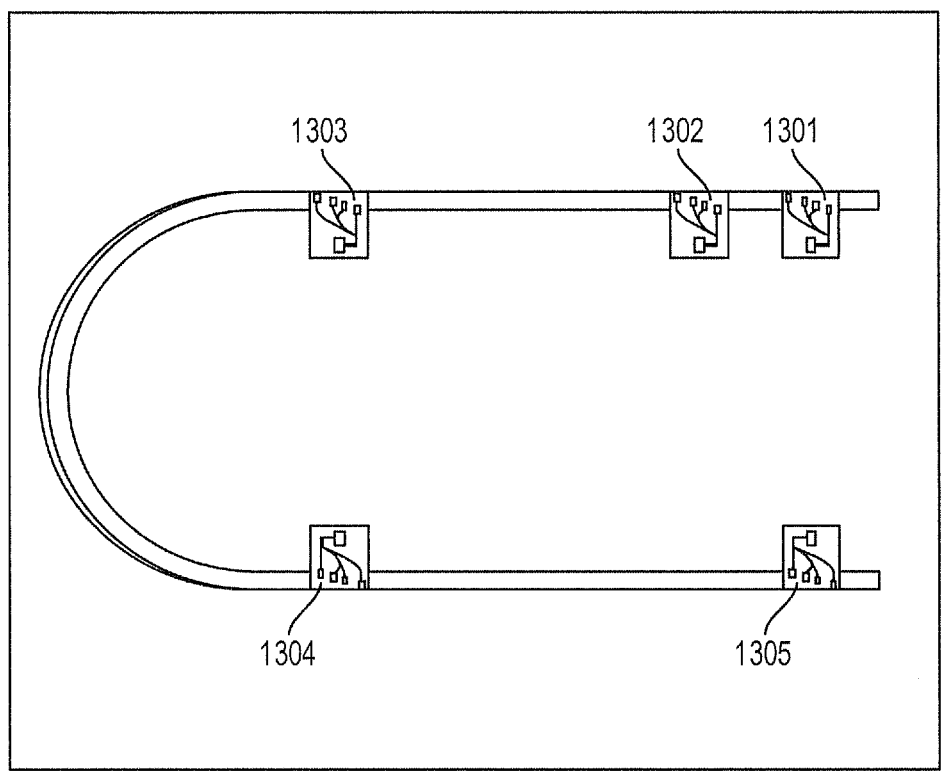
FIG. 16 shows a sample demonstration plate using a particular embodiment.

A test system was fabricated to test the designed digital sensor-bus and to demonstrate that all of the portions of the system integrated together. A mask was chemical-etched from steel shim stock to expose a "U" shaped channel on a 75×75×2.5 cm CFRP plate. The modified manufacturing process described above was carried out, inserting five flex-tail adapters 1301-1305, as shown in FIG. 16. The Intelli-Connector™ digital sensor nodes were bonded to the center of the plate in an isosceles triangle formation, and then plugged into flex-tail adapters 1301-1305 in the middle of the sensor-bus fabrication area. At the end of the bus, a small CAN terminator plug was inserted to establish the correct line impedance for transmission. Finally, a hub board was plugged into the front of the bus to convert CAN signals to a USB protocol, which was then connected to a computer to control the damage detection experiment. This arrangement replicated an experiment that had previously been performed numerous times on a variety of types of plates; however, in this case the cable-free digital sensor-bus was used for power and communication in place of a traditional FireWire cable harness. A cylindrical magnet 12.7 mm diameter by 6 mm tall was placed on the plate using shear-gel in various locations within the triangle formed by the sensor nodes. From the control computer, Lamb-wave pulse-echo tests were commanded for each of the sensor nodes, and their response was stored in comma-delimited files on the computer.

Subsequently, an analysis of the sensor data was performed using a Matlab™ algorithm to predict the location of the magnet based on the nearest intersection of the damage radii estimates from each of the sensor nodes. Following this procedure ten times with the magnet and ten times without the magnet, no communication or power problems were encountered and the presence of the magnet was correctly identified each time. Across these trials the average error in the distance predicted by the algorithm was 7.5 mm.

The experiments indicate that using a cable-free digital sensor bus formed using DW techniques for SHM applications may not reduce the SHM sensor nodes' ability to detect damage. Additionally, these experiments demonstrate suitable fabrication techniques that can be used to form a cable-free digital sensor bus. Use of automated systems to prepare the cable-free digital sensor bus, such as video alignment tools to improve trace placement accuracy, may further improve the systems and methods disclosed.

In a particular embodiment, elements of a sensor system other than the bus are also formed using direct-write techniques. For example, a sensor system may include a substrate, a bus having a plurality of conductive elements that are formed on the substrate using a direct-write technique, and at least one sensor system element coupled to at least one conductive element of the plurality of conductive elements, where at least a portion of the at least one sensor system element was formed on the substrate using the at least one direct-write technique. The substrate may be the structure to be monitored or an intermediate layer. In a particular embodiment, the substrate is flexible and conforms to a surface of the structure to which the substrate is coupled.

The sensor system element may include a structural health sensor that is operable to monitor structural health of the substrate or the structure to which the substrate is coupled. The structural health sensor may transmit data related to the structural health of the substrate or structure to another sensor system element via the bus. The sensor system element may include a signal processor, a multiplexor, an amplifier, a transistor or other circuit component, or any combination thereof. For example, an ultrasonic sensor may be formed on the substrate or on a film applied to the substrate using one or more printing techniques, such as screen printing, flexography, or Gravure printing.

The disclosed cable-free digital sensor systems and methods involve patterning of communication, power and shield traces, or any combination thereof, individually or as layers using one or more DW technologies. Sensor system elements may also be formed using the one or more DW technologies. The traces, the sensor system elements, or both, may be applied directly to a structure or may be applied to an intermediary layer that is subsequently applied to the structure to form a bus. The bus may replace wires, cables and/or cable harnesses that would otherwise be used to connect sensors to a network at the structure. The cable-free digital sensor systems may provide significant reduction of weight, with a DW sensor-bus weighing approximately 20% of a comparable traditional cable. Additional benefits may include increased reliability as a result of eliminating vibration and snag concerns, increased durability by eliminating fraying and corrosion, and reduced instrumentation time and cost through an automated process. In particular embodiments, the cable-free digital sensor systems may be used to form large sensor arrays, such as those used to facilitate structural health monitoring and/or health and usage monitoring. However, the cable-free digital sensor systems may be used in other applications as well. For example, the disclosed cable-free digital bus may be used with any type or combination of sensor elements that are capable of outputting a digital signal. The sensors used may be of the same type or different types. Additionally, the cable-free digital bus may support more than one network of sensors. For example, a structural health monitoring system and a communication system, a distributed computing system, a flight control system another type of digital system, or any combination thereof may operate simultaneously via the cable-free digital bus. In addition to digital sensors, the cable-free digital bus may support communication between non-sensing elements, such as computing elements (e.g., data processors), routing elements (e.g., data routers or hubs), actuating elements (e.g., devices that are capable of receiving a digital input and generating movement in response to the digital input), indicators (e.g., instrument readouts, visual indicators, audible indicators), or any combination thereof.

The cable-free digital sensor systems may be particularly useful for aerospace applications (aircraft, unmanned aerial vehicles (UAVs), expendable & reusable spacecraft, satellites, space/lunar stations, missiles, etc). There may also be significant benefits from using the cable-free digital sensor systems in naval vessels (ships, subs, oil-platforms, unmanned underwater vehicles (UUVs), etc), ground vehicles (cars, trucks, tanks, unmanned ground vehicles (UGV), etc) and civil infrastructure (buildings, bridges, roadways, pipelines, power-plants, wind-turbines, oil-rigs, towers, radomes, etc). The cable-free digital sensor systems may also be useful for human/biological/biomedical health monitoring systems.

In-situ monitoring technologies that may use the disclosed cable-free digital sensor systems have the potential for many economic benefits in a broad range of commercial and defense markets. There are several advantages to using cable-free digital sensor systems over traditional practices, such as reduced instrumentation time, fewer wires, elimination of component tear-down for installation, and the facilitation of structural health monitoring (SHM) techniques. The cable-free digital sensor systems can be utilized by structures including aircraft, spacecraft, land-based vehicles, and sea vehicles.

In particular embodiments, SHM techniques enabled by use of the disclosed cable-free digital sensor systems may have benefit such as a reduced need for scheduled manual inspections. Additionally, such SHM may enable the use of condition-based maintenance for efficient structural design and need-based repair. Further, economic gain may be reaped from recaptured operational time and extension of component life. Also, a benefit may be realized in the case where a vehicle is saved from catastrophic failure.

An economic benefit of SHM enabled by the disclosed cable-free digital sensor systems may be to enable the elimination of scheduled manual inspections in lieu of automated, in-situ, continuous inspection. Up to 25% of the life cycle cost for both commercial and military aircraft is currently spent on inspection costs. For applications such as space launch, these costs can exceed 80% of the life cycle expenditures. This is at least partially a consequence of labor intensive manual inspections. By implementing a continuous monitoring system, minimal human intervention may be required. For future reusable launch vehicle designs, quick and accurate inspection enabled by the disclosed cable-free digital sensor systems may support rapid vehicle turnaround.

Additionally, benefit may be realized by embodiments in which the disclosed cable-free digital sensor system is used for continuous monitoring to guide maintenance. Financial savings in such embodiments may be due to the frequency of maintenance that as dictated by the design methodology used. For example, when a new vehicle is built, a choice of the design methodology may drive the inspection and maintenance requirements of the components. Currently, many vehicles use a damage tolerant approach, which sets inspection intervals based upon a predicted critical flaw size to detect and repair a component prior to failure. Continuous monitoring to guide maintenance may be referred to as condition-based maintenance (CBM). Several papers in the literature have claimed as much as a 25-33% decrease in total life costs by using CBM over a traditional damage-tolerant design. Using CBM, a structure (such as an aircraft) may be continuously monitored, allowing the structure to forgo regular inspection and maintenance intervals. CBM combines many of the advantages of the safe-life design principles with those of damage-tolerant design, in that the structure may be relied upon in service for much longer using predictive models; however, there are provisions for maintenance and repair when needed. Additionally, one study has shown that by using CBM to design structural components with lower factors of safety, the weight of an aircraft could be reduced by as much as 25%, thereby improving the range and fuel efficiency. The reliability of the structure may be dependent on the accuracy and accountability of the monitoring system. Thus, a dependable structural health monitoring system may be used. These systems can be implemented on aircraft and other structures to replace regularly scheduled maintenance overhauls and inspection cycles, and to only repair parts when needed.

Further benefit may be achieved by harvesting additional operational time. For example, opportunity cost may be gained by being able to operate a vehicle when it would have been otherwise detained for scheduled inspections or maintenance. For aircraft, many of these inspections involve the tear-down of larger components and can take more than a day before the aircraft is back in service.

For airlines that are attempting to reduce operational costs, SHM enabled by the disclosed cable-free digital sensor systems may provide a significant competitive advantage, especially for a newly introduced aircraft. Current commercial aircraft may be designed for at least 20-25 years of service and up to 90,000 flights (75,000 flights for 737's, 20,000 flights for 747's, and 50,000 flights for 757 and 767's). Future commercial aircraft will likely require at least this endurance. It is believed that in recent years, the average major airline has spent about 12% of its total operating expenses on maintenance and inspection, amounting to an industry total of about $9 billion a year. For smaller airlines this percentage may average about 20% a year, totaling about another $1 billion in costs. Using these figures, implementing an SHM system with a condition-based maintenance philosophy has the potential of saving the airline industry about $2.5-3 billion a year.

There are several documents issued by the Federal Aviation Administration (FAA) that regulate how aircraft may be inspected. The FAR 25 lists the acceptable engineering design criteria for the damage tolerant design of an aircraft. The Code of Federal Regulations (CFR) Title 14 Part 145 requires that all maintenance be performed using methods prescribed by Advisory Circular (AC) 43.13-1B. Additionally, for each certified commercial aircraft, an Aircraft Maintenance Manual (AMM) is created by the manufacturer in conjunction with the FAA CFR Title 14 Part 39 that lists each component to be inspected, the inspection interval, the type of damage to be concerned about, and the suggested methods to be used for the inspection. While there is currently no specific provision in any of the published directives for a structural health monitoring system, it is believed that a structural health monitoring system could be implemented under the current regulations since the structural health monitoring system would utilize similar or superior sensing methods, and the structural health monitoring system would monitor a vehicle more frequently.

Particular embodiments of the disclosed cable-free digital sensor system may be useful in vehicles with SHM systems. For example, in the Orion spacecraft there are three primary uses for damage detection systems that may use embodiments disclosed here. First, a cable-free digital sensor system may provide detection and localization capabilities for a backshell of the Orion spacecraft to detect micrometeoroid/orbiting debris (MMOC) damage. Next, the cable-free digital sensor system may provide leak detection and localization capabilities for the Orion spacecraft's crew module pressure vessel. Finally, a cable-free digital sensor system may provide several unused flexible acquisition channels in the existing hardware to support future expansion of other sensors, as well as modularity in the bus to accept further branches.

In another example, spacecraft and related systems may use the cable-free digital sensor systems disclosed. To illustrate, elements of the Constellation program, such as Ares V composite interstage and composite overwrapped pressure vessels (COPY), may use a cable-free digital sensor system. The disclosed cable-free digital sensor systems may also be implemented as part of other crew exploration and reusable launch vehicles (CEV and RLV) for quick turn-around times, expendable launch systems for pre-launch go/no-go decisions, and in the international space station to detect impacts or other damage.

The disclosed cable-free digital sensor systems may also be used in commercial markets for SHM. For example, aging fixed and rotary-wing aircraft may be retro-fit to include a cable-free digital sensor system. Likewise, cable-free digital sensor systems may be installed in new fixed and rotary-wing aircraft. Unmanned vehicles (UAV and UCAV) and commercial aircraft may also use the disclosed cable-free digital sensor systems. Additionally, cable-free digital sensor systems may be beneficial for use in water craft (e.g., ships, submarines, carriers), land-based vehicles (e.g., cars, trucks, tanks) and civil infrastructure (e.g., bridges, tunnels, buildings).

Although the present specification describes components and functions that may be implemented in particular embodiments with reference to particular standards and protocols, the disclosed embodiments are not limited to such standards and protocols. For example, standards for Internet and other network transmission (e.g., TCP/IP, UDP/IP, HTML, HTTP, CAN) represent examples of the state of the art. Such standards are periodically superseded by faster or more efficient equivalents having essentially the same functions. Accordingly, replacement standards and protocols having the same or similar functions as those disclosed herein are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations, of various embodiments. Combinations of the above embodiments, and other embodiments not specifically described herein, will be apparent to those of skill in the art upon reviewing the description.

The Abstract of the Disclosure is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, claimed subject matter may be directed to less than all of the features of any of the disclosed embodiments. Thus, the following claims are incorporated into the Detailed Description, with each claim standing on its own as defining separately claimed subject matter.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
applying one or more communication traces and one or more power traces to a structure using at least one direct-write technique;
coupling the one or more communication traces to at least one digitizing sensor;
coupling the one or more power traces to the at least one digitizing sensor; and
coupling the one or more communication traces to at least one actuator, wherein the one or more communication traces enables synchronization between the actuator and the digitizing sensor.

2. The method of claim 1, wherein the one or more communication traces include at least one synchronization trace.

3. The method of claim 1, further comprising applying one or more shield traces to the structure using the at least one direct-write technique, wherein the one or more communication traces comprise at least two communication traces, and wherein the one or more shield traces are applied between the at least two communication traces.

4. The method of claim 1, further comprising applying a first conductive shield layer to the structure before applying the one or more communication traces, wherein the one or more communication traces are applied over the first conductive shield layer.

5. The method of claim 4, further comprising applying a second conductive shield layer over the one or more communication traces.

6. The method of claim 5, further comprising:
applying a first insulating layer between the first conductive shield layer and the one or more communication traces; and
applying a second insulating layer between the one or more communication traces and the second conductive shield layer.

7. The method of claim 1, further comprising applying a dielectric layer to the structure before applying the one or more communication traces.

8. The method of claim 7, wherein the dielectric layer includes a pressure sensitive adhesive.

9. The method of claim 1, wherein the at least one direct-write technique comprises spraying or painting on a material that forms a conductor.

10. The method of claim 1, wherein the at least one direct-write technique comprises a plasma flame spray technique.

11. The method of claim 1, wherein the at least one direct-write technique comprises a jetted atomized deposition technique.

12. The method of claim 1, wherein the one or more communication traces are applied using a first direct-write technique and one or more power traces are applied using a second direct-write technique, wherein the first direct write technique is different than the second direct-write technique.

13. The method of claim 1, wherein applying the one or more communication traces to the structure comprises:
using the at least one direct-write technique to form the one or more communication traces on an intermediary layer; and
applying the intermediary layer to the structure.

14. The method of claim 1, wherein the digitizing sensor comprises at least one processor that processes information gathered by the digitizing sensor and transmits the processed information via the one or more communication traces to a central processor.

15. The method of claim 14, wherein the information includes data regarding structural integrity of the structure, and wherein the central processor corresponds to a structural health monitoring system.

16. The method of claim 1, wherein the digitizing sensor differentiates between first data to report and second data, and wherein the digitizing sensor sends the first data via the one or more communication traces to a central processor.

17. The method of claim 1, further comprising coupling the one or more communication traces to a hub, wherein the hub is adapted to receive signals from the digitizing sensor via the one or more communication traces using a first protocol and to convert the signals to a second protocol.

18. The method of claim 1, further comprising coupling the one or more communication traces to at least one second digitizing sensor.

19. The method of claim 1, further comprising coupling the one or more communication traces to at least one second actuator.

20. The method of claim 1, wherein the actuator is adapted to emit an acoustic signal and the digitizing sensor is adapted to determine, based on the acoustic signal, data regarding structural integrity of the structure.

* * * * *